United States Patent
He

(10) Patent No.: US 11,009,978 B2
(45) Date of Patent: May 18, 2021

(54) OLED PANEL, OLED APPARATUS, FINGERPRINT IDENTIFICATION METHOD AND DEVICE THEREOF, AND STORAGE MEDIUM

(71) Applicant: Beijing Xiaomi Mobile Software Co., Ltd., Beijing (CN)

(72) Inventor: Quanhua He, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 142 days.

(21) Appl. No.: 15/991,085

(22) Filed: May 29, 2018

(65) Prior Publication Data

US 2018/0348936 A1    Dec. 6, 2018

(30) Foreign Application Priority Data

May 31, 2017    (CN) .......................... 201710405861.1

(51) Int. Cl.
*G06F 3/041* (2006.01)
*G06K 9/00* (2006.01)
(Continued)

(52) U.S. Cl.
CPC ......... *G06F 3/0412* (2013.01); *G06K 9/0004* (2013.01); *G09G 3/3208* (2013.01); *H01L 27/323* (2013.01); *H01L 27/3227* (2013.01); *H01L 51/5284* (2013.01); *H01L 27/288* (2013.01)

(58) Field of Classification Search
None
See application file for complete search history.

(56) References Cited

U.S. PATENT DOCUMENTS

2015/0331508 A1    11/2015    Nho et al.
2017/0221972 A1    8/2017    Yang et al.
(Continued)

FOREIGN PATENT DOCUMENTS

CN    107275374 A    10/2017
WO    2017024850 A1    2/2017

OTHER PUBLICATIONS

Extended European search report issued in corresponding European Application No. 18175211.4, dated Aug. 22, 2018, 7 pages.

*Primary Examiner* — Amare Mengistu
*Assistant Examiner* — Sarvesh J Nadkarni
(74) *Attorney, Agent, or Firm* — Arch & Lake LLP

(57) ABSTRACT

An OLED panel, apparatus, fingerprint identification method and device are provided in the field of display technology. The OLED panel includes an OLED pixel array comprising a plurality of OLED sub-pixels, and a photoelectric detection circuitry comprising a plurality of photoelectric detectors. The plurality of photoelectric detectors are respectively disposed between the plurality of OLED sub-pixels. At least one of the plurality of photoelectric detectors is configured to detect light rays whose wavelength ranges are outside of wavelength ranges of light rays emitted from the OLED sub-pixels adjacent to the photoelectric detector. The present disclosure may perform the fingerprint identification only with the display area of the OLED panel, such that the occupancy area of the screen on the OLED panel is increased, thereby increasing the screen ratio and improving the display performance.

20 Claims, 4 Drawing Sheets

(51) Int. Cl.
*H01L 27/32* (2006.01)
*G09G 3/3208* (2016.01)
*H01L 51/52* (2006.01)
*H01L 27/28* (2006.01)

(56) References Cited

U.S. PATENT DOCUMENTS

2018/0225500 A1* 8/2018 Han ..................... G06K 9/0004
2018/0300525 A1* 10/2018 Fourre ............... G06K 9/00093

* cited by examiner

OLED PANEL, OLED APPARATUS, FINGERPRINT IDENTIFICATION METHOD AND DEVICE THEREOF, AND STORAGE MEDIUM

CROSS-REFERENCE TO RELATED APPLICATION

This application is based on and claims priority to Chinese Patent Application Serial No. 201710405861.1, filed with the State Intellectual Property Office of P. R. China on May 31, 2017, the entire contents of which are incorporated herein by reference.

TECHNICAL FIELD

The present disclosure relates to electronic technology field, more particularly, to an Organic Light-Emitting Diode (OLED) panel, apparatus, fingerprint identification method and device thereof and storage medium.

BACKGROUND

Fingerprints are lifelong unchanged and unique, and people have different fingerprints. With the development of electronic technology, in order to ensure the security of user identities, fingerprint identification technology has been more and more widely used. For example, fingerprint identifications are used in payment authentication, unlocking devices/applications, and other application scenarios.

Currently, most terminal devices may be equipped with a sensor for the fingerprint identification to identify the user's fingerprint.

SUMMARY

The present disclosure provides an OLED panel, OLED apparatus, fingerprint identification method and device, and storage medium.

According to a first aspect of the present disclosure, there is provided an OLED panel. The OLED panel includes: an OLED pixel array including a plurality of OLED sub-pixels configured to emit light rays of M different wavelength ranges, wherein the M is a natural number not less than 3; and a photoelectric detection circuitry including a plurality of photoelectric detectors configured to detect the light rays of M different wavelength ranges. The plurality of photoelectric detectors are respectively disposed at gaps between the plurality of OLED sub-pixels, or the plurality of photoelectric detectors are respectively disposed on black matrixes between the plurality of OLED sub-pixels. At least one of the plurality of photoelectric detectors is configured to detect the light rays whose wavelength ranges are outside of wavelength ranges of light rays emitted from the OLED sub-pixels adjacent to the photoelectric detector.

According to a second aspect of the present disclosure, there is provided an OLED apparatus. The OLED apparatus includes an OLED panel and a drive circuit. The OLED panel includes: an OLED pixel array including a plurality of OLED sub-pixels configured to emit light rays of M different wavelength ranges, wherein the M is a natural number not less than 3; and a photoelectric detection circuitry including a plurality of photoelectric detectors configured to detect the light rays of M different wavelength ranges. The plurality of photoelectric detectors are respectively disposed at gaps between the plurality of OLED sub-pixels, or the plurality of photoelectric detectors are respectively disposed on black matrixes between the plurality of OLED sub-pixels. At least one of the plurality of photoelectric detectors is configured to detect light rays whose wavelength ranges are outside of wavelength ranges of light rays emitted from the OLED sub-pixels adjacent to the photoelectric detector. The drive circuit is configured to: identify, in response to a touch operation for fingerprint identification, a location of a touch area being touched; enable, based on the location of the touch area, a plurality of OLED sub-pixels emit light rays; select, based on the location of the touch area, a plurality of designated photoelectric detectors from the plurality of photoelectric detectors; and detect reflected light of the light rays with the plurality of designated photoelectric detectors; and generate a fingerprint image based on the positions of the plurality of designated photoelectric detectors and intensities of the reflected light detected by the plurality of designated photoelectric detectors.

According to a third aspect of the present disclosure, there is provided a fingerprint identification method. The fingerprint identification method is applied to a terminal provided with an OLED panel.

The OLED panel includes: an OLED pixel array including a plurality of OLED sub-pixels configured to emit light rays of M different wavelength ranges, wherein the M is a natural number not less than 3; and a photoelectric detection circuitry including a plurality of photoelectric detectors configured to detect the light rays of M different wavelength ranges. The plurality of photoelectric detectors are respectively disposed at gaps between the plurality of OLED sub-pixels, or the plurality of photoelectric detectors are respectively disposed on black matrixes between the plurality of OLED sub-pixels. At least one of the plurality of photoelectric detectors is configured to detect the light rays whose wavelength ranges are outside of wavelength ranges of light rays emitted from the OLED sub-pixels adjacent to the photoelectric detector.

The method includes: identifying, in response to a touch operation for fingerprint identification, a location of a touch area being touched; enabling, based on the location of the touch area, a plurality of OLED sub-pixels to emit light rays; selecting, based on the location of the touch area, a plurality of designated photoelectric detectors from the plurality of photoelectric detectors; and detecting the reflected light of the light rays with the plurality of designated photoelectric detectors; and generating a fingerprint image based on the positions of the plurality of designated photoelectric detectors and intensities of the reflected light detected by the plurality of designated photoelectric detectors.

According to a fourth aspect of the present disclosure, there is provided a fingerprint identification device. The fingerprint identification device is with an OLED panel. The OLED panel includes: an OLED pixel array including a plurality of OLED sub-pixels configured to emit light rays of M different wavelength ranges, wherein the M is a natural number not less than 3; and a photoelectric detection circuitry including a plurality of photoelectric detectors configured to detect the light rays of M different wavelength ranges. The plurality of photoelectric detectors are respectively disposed at gaps between the plurality of OLED sub-pixels, or the plurality of photoelectric detectors are respectively disposed on black matrixes between the plurality of OLED sub-pixels. At least one of the plurality of photoelectric detectors is configured to detect light rays whose wavelength ranges are outside of wavelength ranges of light rays emitted from the OLED sub-pixels adjacent to the photoelectric detector. The device includes: a processor; and a memory storing executable instructions executed by the processor. The processor is configured to: identify, in response to a touch operation for fingerprint identification, a location of a touch area being touched; enable, based on the location of the touch area, a plurality of OLED sub-pixels to emit light rays; select, based on the location of the touch area, a plurality of designated photoelectric detectors from the plurality of photoelectric detectors; and detect reflected light of the light rays with the plurality of designated photoelectric detectors; and generate a fingerprint image based on positions of the plurality of designated photoelectric detectors and intensities of the reflected light detected by the plurality of designated photoelectric detectors.

According to a fifth aspect of the present disclosure, there is provided a computer readable storage medium for a terminal with an OLED panel.

The OLED panel includes: an OLED pixel array including a plurality of OLED sub-pixels configured to emit light rays of M different wavelength ranges, wherein the M is a natural number not less than 3; and a photoelectric detection circuitry including a plurality of photoelectric detectors configured to detect the light rays of M different wavelength ranges. The plurality of photoelectric detectors are respectively disposed at gaps between the plurality of OLED sub-pixels, or the plurality of photoelectric detectors are respectively disposed on black matrixes between the plurality of OLED sub-pixels. At least one of the plurality of photoelectric detectors is configured to detect light rays whose wavelength ranges are outside of wavelength ranges of light rays emitted from the OLED sub-pixels adjacent to the photoelectric detector.

The computer readable storage medium comprise at least an instruction, a program, a code set or instruction set loaded and executed by the processor to identify, in response to a touch operation for fingerprint identification, a location of a touch area being touched; enable, based on the location of the touch area, a plurality of OLED sub-pixels to emit light rays; select, based on the location of the touch area, a plurality of designated photoelectric detectors from the plurality of photoelectric detectors; and detect reflected light of the light rays with the plurality of designated photoelectric detectors; and generate a fingerprint image based on positions of the plurality of designated photoelectric detectors and intensities of the reflected light detected by the plurality of designated photoelectric detectors.

It is to be understood that both the foregoing general description and the following detailed description are exemplary and explanatory only and are not restrictive of the present disclosure.

BRIEF DESCRIPTION OF THE DRAWINGS

The drawings herein are incorporated in and constitute a part of this specification of the present disclosure, showing embodiments consistent with the present disclosure, and explaining the principles of the present disclosure together with the specification.

DETAILED DESCRIPTION

Figure 1:
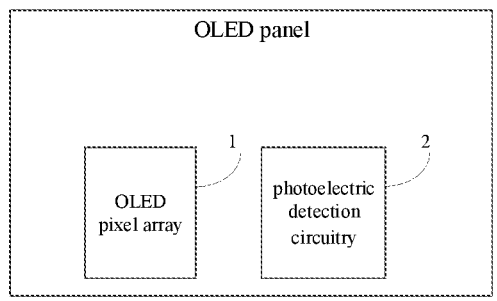
FIG. 1 is a structural schematic diagram of a first OLED panel shown in accordance with an aspect of the disclosure.

Hereinafter, exemplary embodiments will be described in detail. In the following description when referring to the drawings, the same numerals in the different drawings denote the same or similar elements unless otherwise indicated. The embodiments described in the following exemplary embodiments are not representative of all embodiments consistent with the present disclosure. Rather, they are merely examples of devices and methods consistent with some aspects of the present disclosure as detailed in the appended claims.

Application scenarios for the embodiments of the present disclosure are illustrated prior to the detailed description of the embodiments of the present disclosure. In order to ensure the safety of user's identity, fingerprint identification technology is more and more widely used in scenarios where identity authentication is required, such as bank payment, application unlock and the like. Currently, a terminal generally performs fingerprint identification though the physical button in a panel. The physical key can then be configured with a sensor for the fingerprint identification to identify the user's fingerprint. In order to facilitate the user to press the fingerprint, and in order that the fingerprint may be identified more accurately, the size of the physical key is often relatively large. Then the physical button occupies a large area on the panel, while the screen occupies an area smaller relative to the panel, resulting in low screen ratio of the terminal and low display performance of the terminal. To this end, the present disclosure provides an OLED panel to increase the screen ratio of the terminal and improve the display performance of the terminal.

FIG. 1 is a structural schematic diagram of an OLED panel shown in accordance with an aspect of the disclosure. The OLED panel includes: an OLED pixel array 1 and a photoelectric detection circuitry 2.

Figure 2A:
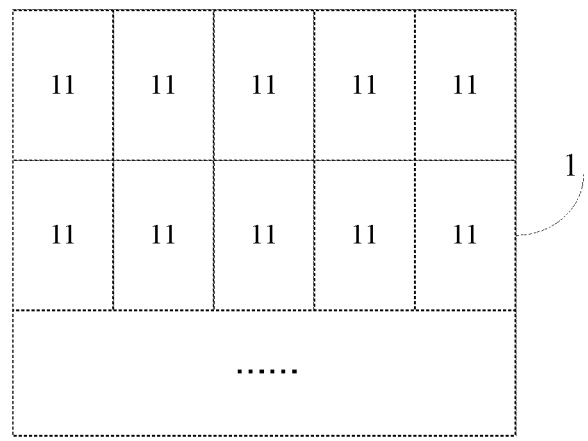
FIG. 2A is a structural schematic diagram of an OLED pixel array shown in accordance with an aspect of the disclosure.

Referring to FIG. 2A, the OLED pixel array 1 includes a plurality of OLED sub-pixels 11. The plurality of OLED sub-pixels 11 are configured to emit light rays of M different wavelength ranges and M is a natural number not less than 3.

Figure 2B:
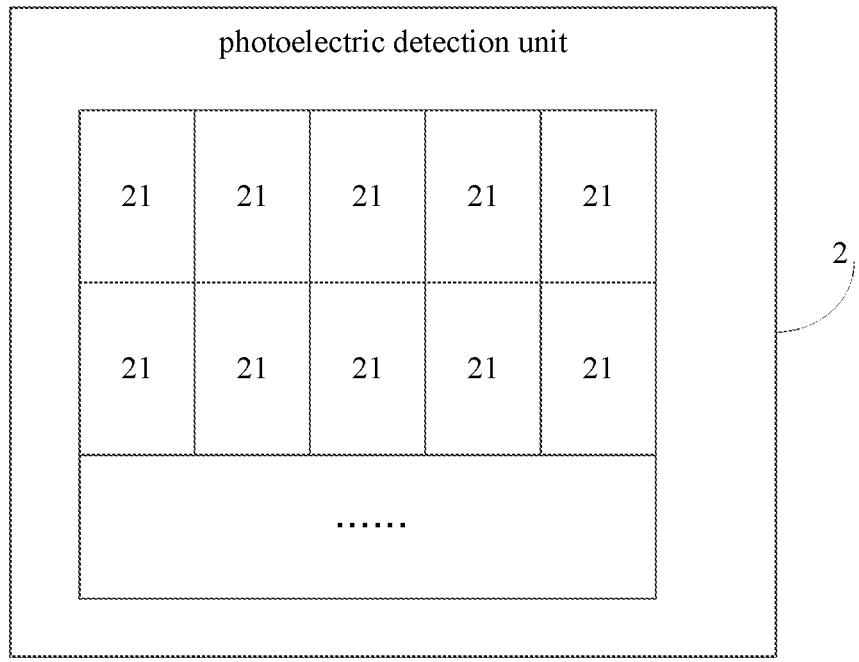
FIG. 2B is a structural schematic diagram of photoelectric detection circuitry shown in accordance with an aspect of the disclosure.

Referring to FIG. 2B, the photoelectric detection circuitry 2 includes a plurality of photoelectric detectors 21. The plurality of photoelectric detectors 21 detectors are configured to detect the light rays of M different wavelength ranges.

Figure 3A:
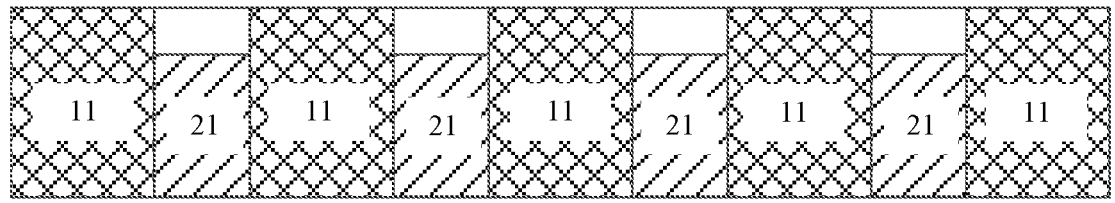
FIG. 3A is a structural schematic diagram of a second OLED panel shown in accordance with an aspect of the disclosure.
Figure 3B:
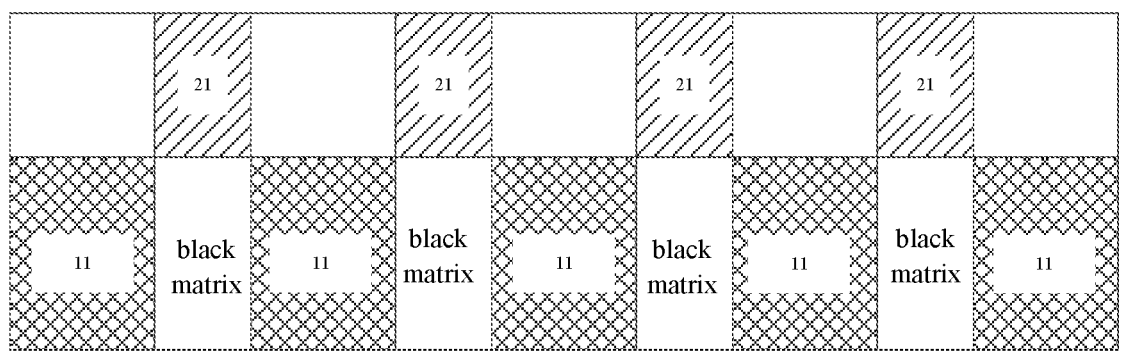
FIG. 3B is a structural schematic diagram of a third OLED panel shown in accordance with an aspect of the disclosure.

Here, the plurality of photoelectric detectors are respectively disposed between the plurality of OLED sub-pixels. As shown in the example in FIG. 3A, the plurality of photoelectric detectors 21 are respectively disposed at gaps between the plurality of OLED sub-pixels 11. As shown in the other example in FIG. 3B, the plurality of photoelectric detectors 21 are respectively disposed on black matrixes between the plurality of OLED sub-pixels 11.

At least one of the plurality of photoelectric detectors 21 is configured to detect light rays whose wavelength ranges are outside of wavelength ranges of light rays emitted from the OLED sub-pixels adjacent to the photoelectric detector. In one or more embodiments, each of the plurality of photoelectric detectors 21 is configured to detect light rays whose wavelength ranges are not falling within wavelength ranges of light rays emitted from the OLED sub-pixels adjacent to the photoelectric detector.

In one example, each of the plurality of OLED sub-pixels 11 may emit light rays with one wavelength range, and the plurality of OLED sub-pixels 11 may emit light rays of M different wavelength ranges.

Additionally, each of the plurality of photoelectric detectors 21 may detect light rays with one wavelength range, and the plurality of photoelectric detectors 21 may detect light rays of M different wavelength ranges.

In one or more embodiments, when the plurality of photoelectric detectors 21 are respectively disposed at gaps between the plurality of OLED sub-pixels 11, the plurality of photoelectric detectors 21 may be added separately, or by replacing the original black matrixes at the gaps between the plurality of OLED sub-pixels 11. The black matrixes are configured to prevent backlight leakage and improve display contrast.

Additionally or alternatively, when the plurality of photoelectric detectors 21 are respectively disposed on the black matrixes between the plurality of OLED sub-pixels 11, the plurality of photoelectric detectors 21 may be added separately or be disposed in an original protective layer on the black matrixes. The protective layer is configured to prevent oxidation of the OLED pixel array 1 due to impurities such as water and oxygen.

Additionally or alternatively, when the plurality of photoelectric detectors 21 are respectively disposed at the gaps between the plurality of OLED sub-pixels 11 or on the black matrixes between the plurality of OLED sub-pixels 11, the plurality of photoelectric detectors 21 and OLED pixel array 1 are both disposed in the same area of the OLED panel. Since the OLED pixel array 1 is disposed in the display area of the OLED panel used to display an image, the plurality of photoelectric detectors 21 are also disposed in the display area of the OLED panel. A terminal provided with the OLED panel may directly perform fingerprint identification or palm print identification with the plurality of photoelectric detectors 21 disposed in the display area of the OLED panel, and no additional physical button needs to be provided on the OLED panel, thereby avoiding additional occupancy of the physical button on the OLED panel and increasing the occupancy area of the screen on the OLED panel. As a result, the screen ratio is increased and the display performance is improved.

It should be noted that, for each of the plurality of OLED sub-pixels 11, it may emit light rays through a corresponding Thin Film Transistor (TFT). For example, voltage may be applied to the gate of the TFT corresponding to the OLED sub-pixel to turn on the TFT. After the TFT is turned on, voltage is applied to the source of the TFT such that the OLED pixel may emit light rays.

Additionally or alternatively, all of the plurality of photoelectric detectors 21 may convert the detected light rays into electric signals. And in order to ensure the accuracy of subsequent fingerprint identification, the plurality of photoelectric detectors 21 may be set to be with a small size, for example, being the same as the size the OLED sub-pixels. Of course, the plurality of photoelectric detectors 21 may also be set to be with a relatively small size, such as 40 micrometers, 50 micrometers or the like, which is not limited in the embodiments of the present disclosure.

It should be noted that for each of the plurality of photoelectric detectors 21, it is configured to detect light rays whose wavelength ranges are not falling within wavelength ranges of light rays emitted from the adjacent OLED sub-pixels, such that the photoelectric detector may be protected from interference from light rays emitted from its adjacent OLED sub-pixels, thereby improving the detection accuracy of the photoelectric detector.

For example, the plurality of OLED sub-pixels include a plurality of R sub-pixels, a plurality of G sub-pixels, and a plurality of B sub-pixels. The R sub-pixels are used to emit red light, the G sub-pixels are used to emit green light, and the B sub-pixels are used to emit blue light. Red light, green light, and blue light have different wavelength ranges. Here, the photoelectric detector between an R sub-pixel and a G sub-pixel may be used to detect blue light, the photoelectric detector between a G sub-pixel and a B sub-pixel may be used to detect red light, and the photoelectric detector between a B sub-pixel and an R sub-pixel may be used to detect green light. Here, each photoelectric detector will be protected from the light rays emitted from its adjacent OLED sub-pixels and the detection accuracy is relatively high.

It should be noted that the photoelectric detection circuitry 2 is configured to form a portion of a detection circuit of a photoelectric biometric sensor. Here, the photoelectric detection circuitry 2 may detect biological features, such as fingerprints and palm prints through photoelectricity.

Here, the photoelectric biometric sensor is configured to identify biological features through photoelectricity. For example, the photoelectric biometric sensor may be a fingerprint sensor, a palm print sensor and the like. When the photoelectric biometric sensor is a fingerprint sensor, since the plurality of photoelectric detectors 21 are all disposed in the display area of the OLED panel and the display area of the OLED panel is often relatively large, the fingerprint sensor may be configured to simultaneously identify the fingerprints of at least two fingers.

In the present disclosure, the OLED panel includes an OLED pixel array and a photoelectric detection circuitry. The plurality of photoelectric detectors included in the photoelectric detection circuitry are all located in the display area of the OLED panel. Therefore, a terminal provided with the OLED panel may directly perform the fingerprint identification or palm print identification with the plurality of photoelectric detectors located in the display area of the OLED panel, and no additional physical button needs to be provided on the OLED panel, thereby avoiding additional occupancy of the physical button on the OLED panel and increasing the occupancy area of the screen on the OLED panel. As a result, the screen ratio is increased and the display performance is improved.

Figure 4:
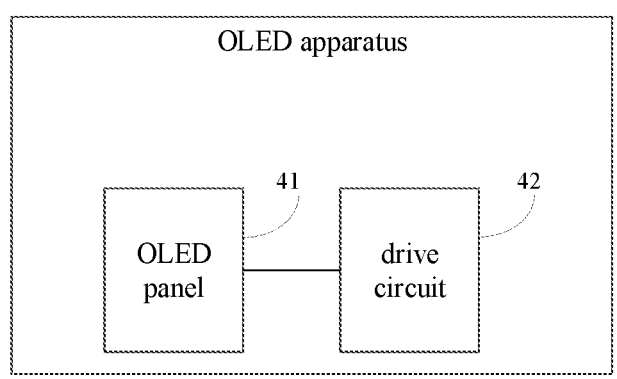
FIG. 4 is a structural schematic diagram of an OLED apparatus shown in accordance with an aspect of the disclosure.

FIG. 4 is a structural schematic diagram of an OLED apparatus shown in accordance with an aspect of the disclosure. Referring to FIG. 4, the OLED apparatus includes the OLED panel 41 described in any of FIG. 1 to FIG. 3B and a drive circuit 42. The drive circuit is configured to: identify, in response to a touch operation for fingerprint identification, a location of a touch area being touched; enable, based on the location of the touch area, a plurality of OLED sub-pixels to emit light rays; select, based on the location of the touch area, a plurality of designated photoelectric detectors from the plurality of photoelectric detectors; and detect reflected light of the light rays with the plurality of designated photoelectric detectors; and determine a fingerprint image based on positions of the plurality of designated photoelectric detectors and intensities of the reflected light detected by the plurality of designated photoelectric detectors.

It should be noted that the touch area of the touch operation is the area that is touched in the touch operation.

Additionally or alternatively, when the touch operation for performing the fingerprint identification is detected, it represents that a user's finger is in proximity to the OLED panel. Therefore, the fingerprint identification may be performed based on the plurality of OLED sub-pixels in the touch area and the plurality of designated photoelectric detectors among the plurality of photoelectric detectors. Since reflected light with different intensities is produced after light rays being reflected at a ridge line and a valley line of the fingerprint, the ridge line position and the valley line position in the fingerprint image may be generated based on the intensities of the reflected light detected by the plurality of designated photoelectric detectors. The fingerprint image is obtained after the ridge line position and the valley line position in the fingerprint image is generated.

It should be noted that the ridge line of a fingerprint is a protruding portion on the fingerprint epidermis, and the valley line of a fingerprint is a recessed portion on the fingerprint epidermis.

In some embodiments, the drive circuit 42 is configured to: select all of the plurality of photoelectric detectors as the designated photoelectric detectors; or, select the photoelectric detectors located in the touch area among the plurality of photoelectric detectors as the designated photoelectric detectors.

It should be noted that, when the plurality of designated photoelectric detectors are the plurality of photoelectric detectors, the drive circuit 42 performs the fingerprint identification with all of the photoelectric detectors in the OLED panel, such that the accuracy of the fingerprint identification may be improved. When plurality of designated photoelectric detectors are the photoelectric detectors in the touch area, the drive circuit 42 performs the fingerprint identification only with the photoelectric detectors in the touch area, such that the processing resource of the drive circuit 42 may be saved.

In some embodiments, the drive circuit 42 is configured to: determine a ridge line position in the fingerprint image corresponding to the position of the designated photoelectric detector, for each of the plurality of designated photoelectric detectors, when the intensity of the reflected light detected by the designated photoelectric detector is within a first preset intensity range, determine a ridge line position in the fingerprint image corresponding to a position of the designated photoelectric detector; and determine, when the intensity of the reflected light detected by the designated photoelectric detector is within a second preset intensity range, a valley line position in the fingerprint image corresponding to a position of the designated photoelectric detector.

It should be noted that the first preset intensity range and the second preset intensity range may both be set in advance, which is not limited in the embodiments of the present disclosure.

Additionally or alternatively, when the intensity of the reflected light detected by the designated photoelectric detector is within the first preset intensity range, it represents that the reflected light detected by the designated photoelectric detector is formed after a light ray is reflected by the ridge line of a fingerprint. Here, the position of the designated photoelectric detector corresponds to the ridge line position in the fingerprint image. When the intensity of the reflected light detected by the designated photoelectric detector is within the second preset intensity range, it represents that the reflected light detected by the designated photoelectric detector is formed after a light ray is reflected by the valley ridge line of a fingerprint. Here, the position of the designated photoelectric detector corresponds to the valley line position in the fingerprint image.

In one or more embodiments of the present disclosure, when the drive circuit detects the touch operation for performing the fingerprint identification, it may first determine the touch area of the touch operation, then emit light rays through the plurality of OLED sub-pixels in the touch area of the OLED panel, and then detect the reflected light of the light rays with the plurality of designated photoelectric detector included in the OLED panel. Afterwards, the fingerprint image is generated based on the positions of the plurality of designated photoelectric detectors and the intensities of the reflected light detected by the plurality of designated photoelectric detectors. In the present disclosure, no additional physical button needs to be provided on the OLED panel and the fingerprint identification may be performed only with the plurality of designated photoelectric detectors disposed in the display area of the OLED panel, thereby avoiding additional occupancy of the physical button on the OLED panel and increasing the occupancy area of the screen on the OLED panel. As a result, the screen ratio is increased and the display performance is improved.

Figure 5:
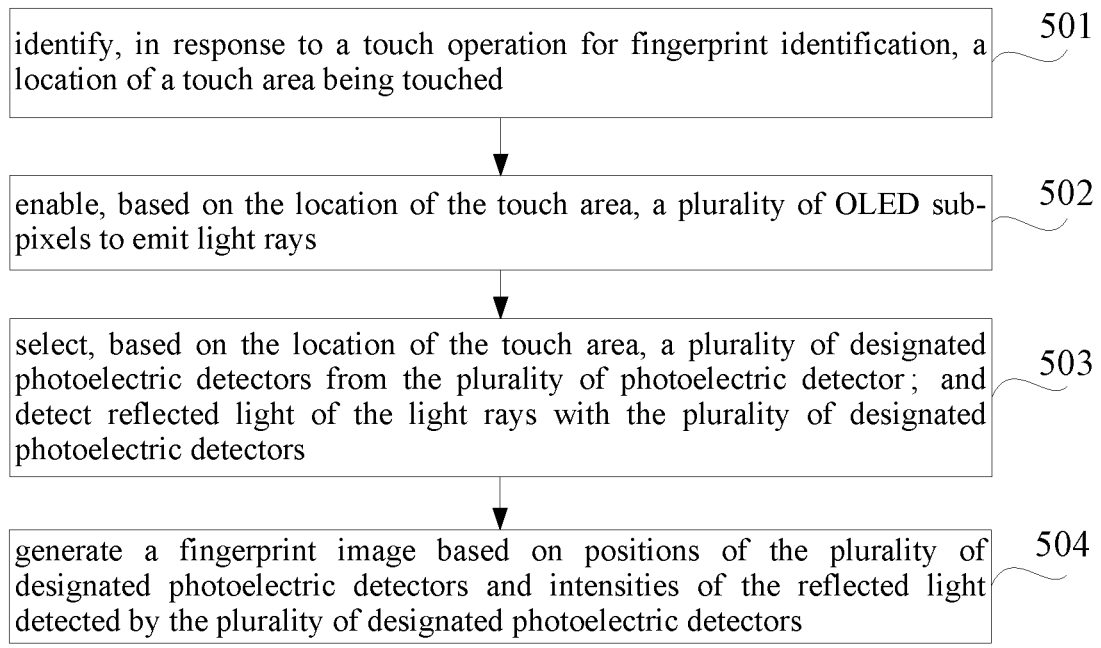
FIG. 5 is a flow chart of a fingerprint identification method shown in accordance with an aspect of the disclosure.

FIG. 5 is a flow chart of a fingerprint identification method shown in accordance with an aspect of the disclosure. The method is applied to a terminal provided with the OLED panel shown in any of FIG. 1 to FIG. 3B above. Referring to FIG. 5, the method includes the following steps.

At step 501, a touch area of a touch operation is identified, when the touch operation for performing a fingerprint identification is detected.

It should be noted that the touch area of the touch operation is the area that is touched in the touch operation.

Additionally, when the touch operation for performing the fingerprint identification is detected, it represents that a user's finger is in proximity to the OLED panel. Therefore, the fingerprint identification may be performed based on the plurality of OLED sub-pixels in the touch area and the plurality of designated photoelectric detectors among the plurality of photoelectric detectors in subsequent steps.

At step 502, light rays are emitted through a plurality of OLED sub-pixels in the touch area.

At step 503, a plurality of designated photoelectric detectors are selected from the plurality of photoelectric detectors and reflected light of the light rays emitted from the plurality of OLED sub-pixels in the touch area is detected with the plurality of designated photoelectric detectors.

Here, when the plurality of designated photoelectric detectors are selected from the plurality of photoelectric detectors, each of the plurality of photoelectric detectors may be selected as the designated photoelectric detector. Here, the terminal performs the fingerprint identification with all of the plurality of photoelectric detectors in the OLED panel, such that the accuracy of the fingerprint identification may be improved. Alternatively, the photoelectric detectors located in the touch area among the plurality of photoelectric detectors may be selected as the designated photoelectric detectors. Here, the terminal performs the fingerprint identification only with the photoelectric detectors in the touch area, such that the processing resource of the terminal may be saved.

At step 504, a fingerprint image is generated based on positions of the plurality of designated photoelectric detectors and the intensities of the reflected light detected by the plurality of designated photoelectric detectors.

Since the light rays form the reflected light with different intensities after being reflected at a ridge line and a valley line of the fingerprint, the ridge line position and the valley line position in the fingerprint image may be determined based on the intensities of the reflected light detected by the plurality of designated photoelectric detectors. The fingerprint image is obtained after the ridge line position and the valley line position in the fingerprint image is determined.

It should be noted that the ridge line of a fingerprint is a protruding portion on the fingerprint epidermis, and the valley line of a fingerprint is a recessed portion on the fingerprint epidermis.

Here, when the fingerprint image is generated based on positions of the plurality of designated photoelectric detectors and the intensities of the reflected light detected by the plurality of designated photoelectric detectors, for each of the plurality of designated photoelectric detectors, when the intensity of the reflected light detected by the designated photoelectric detector is within a first preset intensity range, the position of the designated photoelectric detector is determined to be corresponding to the ridge line position in the fingerprint image. When the intensity of the reflected light detected by the designated photoelectric detector is within a second preset intensity range, the position of the designated photoelectric detector is determined be corresponding to the valley line position in the fingerprint image.

It should be noted that the first preset intensity range and the second preset intensity range may both be set in advance, which is not limited in the embodiments of the present disclosure.

Additionally or alternatively, when the intensity of the reflected light detected by the designated photoelectric detector is within the first preset intensity range, it represents that the reflected light detected by the designated photoelectric detector is formed after a light ray is reflected by the ridge line of a fingerprint. Here, the position of the designated photoelectric detector corresponds to the ridge line position in the fingerprint image. When the intensity of the reflected light detected by the designated photoelectric detector is within the second preset intensity range, it represents that the reflected light detected by the designated photoelectric detector is formed after a light ray is reflected by the valley ridge line of a fingerprint. Here, the position of the designated photoelectric detector corresponds to the valley line position in the fingerprint image.

In the present disclosure, when the terminal detects the touch operation for performing the fingerprint identification, it may first identify the location of the touch area being touched, then enable the plurality of OLED sub-pixels in the touch area of the OLED panel to emit light rays, and then detect the reflected light of the light rays emitted from the plurality of OLED sub-pixels in the touch area with the plurality of designated photoelectric detector included in the OLED panel. Afterwards, the fingerprint image is generated based on the positions of the plurality of designated photoelectric detectors and the intensities of the reflected light detected by the plurality of designated photoelectric detectors. Accordingly, there is no need to provide additional physical button on the OLED panel and the terminal may perform the fingerprint identification using only the plurality of designated photoelectric detectors disposed in the display area of the OLED panel. The disclosed method and apparatus avoid additional occupancy of the physical button on the OLED panel and increase the occupancy area of the screen on the OLED panel. As a result, the screen ratio is increased and the display performance is improved.

There is provided a fingerprint identification device in accordance with an aspect of the disclosure. The device is provided with the OLED panel shown in any of FIG. 1-FIG. 3B. The device includes a processor and a memory storing executable instructions executed by the processor.

The processor is configured to identify, in response to a touch operation for fingerprint identification, a location of a touch area being touched; enable, based on the location of the touch area, a plurality of OLED sub-pixels to emit light rays; select, based on the location of the touch area, a plurality of designated photoelectric detectors from the plurality of photoelectric detectors; and detect reflected light of the light rays with the plurality of designated photoelectric detectors; and generate a fingerprint image based on positions of the plurality of designated photoelectric detectors and intensities of the reflected light detected by the plurality of designated photoelectric detectors.

In some embodiments, the processor is configured to: select all of the plurality of photoelectric detectors as the designated photoelectric detectors. Alternatively, the processor may select the photoelectric detectors located in the touch area among the plurality of photoelectric detectors as the designated photoelectric detectors.

In some embodiments, the processor is configured to: determine, for each of the plurality of designated photoelectric detectors, when the intensity of the reflected light detected by the designated photoelectric detector is within a first preset intensity range, wherein the ridge line is formed by a protruding portion on a fingerprint epidermis; and determine when the intensity of the reflected light detected by the designated photoelectric detector is within a second preset intensity range, a valley line position in the fingerprint image corresponding to a position of the designated photoelectric detector, wherein the valley line is formed by a recessed portion on the fingerprint epidermis.

In the present disclosure, when the touch operation for performing the fingerprint identification is detected, the touch area of the touch operation may be identified first, then light rays may be emitted through the plurality of OLED sub-pixels in the touch area of the OLED panel, and then the reflected light of the light rays emitted from the plurality of OLED sub-pixels in the touch area may be detected with the plurality of designated photoelectric detector included in the OLED panel. Afterwards, the fingerprint image is generated based on the positions of the plurality of designated photoelectric detectors and the intensities of the reflected light detected by the plurality of designated photoelectric detectors. In the present disclosure, there is no need to add additional physical button on the OLED panel and the fingerprint identification may be performed using the plurality of designated photoelectric detectors in the display area of the OLED panel, thereby avoiding additional occupancy of the physical button on the OLED panel and increasing the occupancy area of the screen on the OLED panel. As a result, the screen ratio is increased and the display performance is improved.

With respect to the device of the above embodiment, the specific method of operation performed by each module has been described in detail in the embodiment of the method, and the description thereof may not be described in detail herein.

Figure 6:
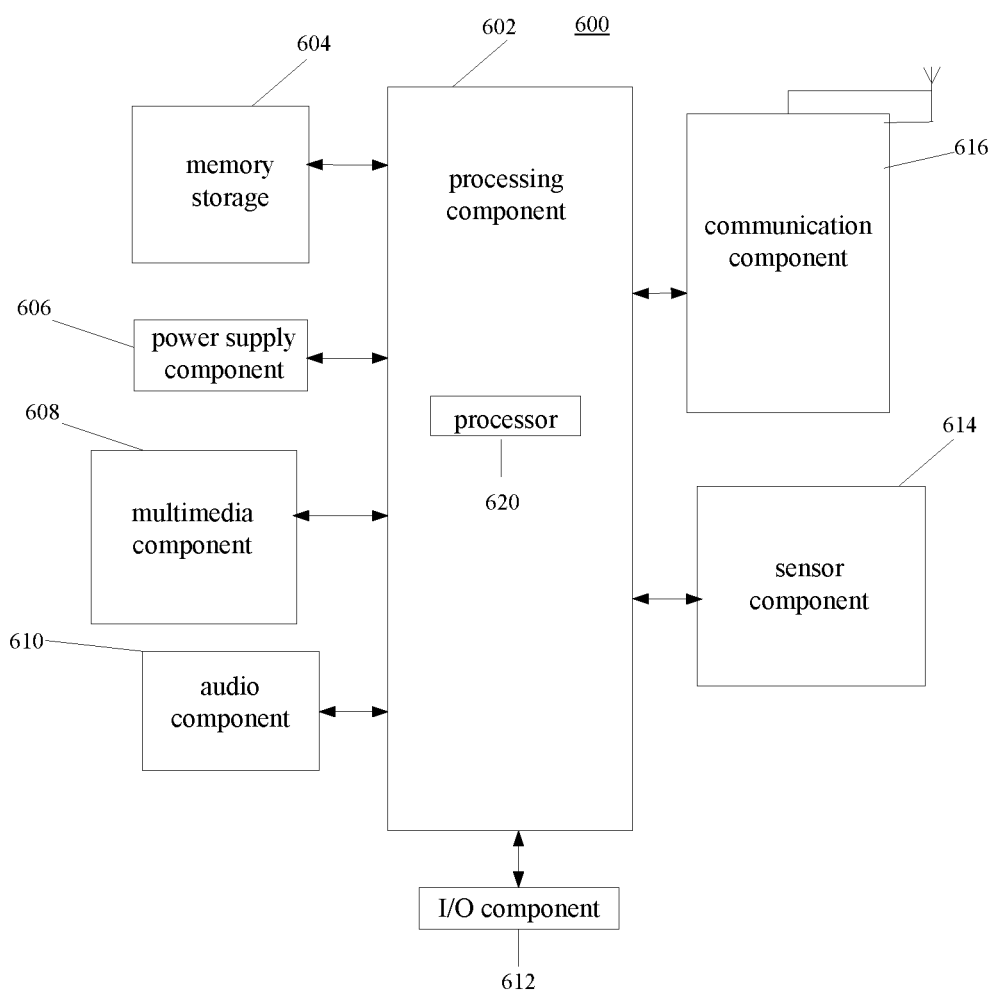
FIG. 6 is a block diagram of a fingerprint identification device shown in accordance with an aspect of the disclosure.

FIG. 6 is a block diagram of a fingerprint identification device 600 shown in accordance with an aspect of the disclosure. For example, the device 600 may be a mobile phone, a computer, a digital broadcast terminal, a messaging device, a game console, a tablet device, a medical device, a fitness device, a personal digital assistant, and the like.

Referring to FIG. 6, the device 600 may include one or more of the following hardware components: a processor 602, a memory 604, a power component 606, a multimedia component 608, an audio component 610, an input/output (I/O) interface 612, a sensor component 614, and a communication component 616.

The processor 602 generally can control the overall operation of the device 600, such as operations associated with display, phone call, data communication, camera operation, and recording operation. The processor 602 may include one or more processors 620 to execute instructions, to complete all or part of the steps described above. In addition, the processor 602 may include one or more modules to facilitate the interactions between the processor 602 and other components. For example, the processor 602 may include a multimedia module to facilitate interaction between the multimedia component 608 and the processor 602.

The memory 604 may be configured to store various types of data to support the operation of the device 600. Examples of such data can include instructions of any application or method operating on the device 600, contact data, phonebook data, messages, pictures, videos, and the like. The memory 604 may be implemented by any type of volatile or nonvolatile memory device or a combination thereof, such as static random access memory (SRAM), electrically erasable programmable read only memory (EEPROM), erasable programmable read only memory (EPROM), programmable read only memory (PROM), read only memory (ROM), magnetic memory, flash memory, disk or CD.

The power component 606 can provide power to the various components of the device 600. The power component 606 may include a power management system, one or more power supplies, and other components associated with generating, managing, and distributing power for the device 600.

The multimedia component 608 may include a screen providing an output interface between the device 600 and the user. In some embodiments, the screen may include a liquid crystal display (LCD) and a touch panel (TP). If the screen includes a touch panel, the screen may be implemented as a touch screen to receive input signals from the user. The touch panel can include one or more touch sensors to sense touches, slides, and gestures on touch panels. The touch sensors may sense not only the boundary of the touch or slide actions, but also the duration and pressure associated with the touch or slide operation. In some embodiments, the multimedia component 608 may include a front camera and/or a rear camera. When the device 600 is in an operating mode, such as a shooting mode or a video mode, the front camera and/or the rear camera can receive external multimedia data. Each front camera and rear camera can be a fixed optical lens system or have focal length and optical zoom capability.

The audio component 610 may be configured to output and/or input an audio signal. For example, the audio component 610 can include a microphone (MIC) that is configured to receive external audio signals when the device 600 is in the operating mode, such as a call mode, a recording mode, and a voice recognition mode. The received audio signals may be further stored in the memory 604 or transmitted via the communication component 616. In some embodiments, the audio component 610 can also include a speaker for outputting the audio signals.

The I/O interface 612 can provide the interface between the processor 602 and a peripheral interface device. The peripheral interface device may be a keyboard, a mouse, buttons, or the like. The buttons may include, but are not limited to, a home button, a volume button, a start button, and a lock button.

The sensor component 614 may include one or more sensors for providing condition assessments of the various aspects of the device 600. For example, the sensor assembly 614 may detect the on/off state of the device 600, the relative positioning of the components, such as the components can be the display and keypad of the device 600, and the sensor component 614 may also detect position changes of the device 600 or any component thereof, presence or absence of the user contact with the device 600, orientation, acceleration/deceleration, or the temperature changes of the device 600. The sensor component 614 may include a proximity sensor configured to detect the presence of a nearby object without any physical contact. The sensor component 614 may also include a light sensor, such as a CMOS or CCD image sensor, for imaging applications. In some embodiments, the sensor component 614 may also include acceleration sensors, gyro sensors, magnetic sensors, pressure sensors, or temperature sensors.

The communication component 616 may be configured to facilitate wired or wireless communication between the device 600 and other devices. The device 600 may access a wireless network based on a communication standard, such as WiFi, 2G or 3G, or a combination thereof. In an aspect of the disclosure, the communication component 616 can receive broadcast signals or broadcast-related information from an external broadcast management system via broadcast channels. In an aspect of the disclosure, the communication component 616 can also include a near field communication (NFC) module to facilitate short-range communication. For example, the NFC module may be implemented based on radio frequency identification (RFID) technology, infrared data association (IrDA) technology, ultra wideband (UWB) technology, Bluetooth (BT) technology and other techniques.

In an aspect of the disclosure, the device 600 may be implemented by one or more application specific integrated circuits (ASICs), digital signal processors (DSPs), digital signal processing devices (DSPDs), programmable logic devices (PLDs), field programmable gate array (FPGA), a controller, a microcontroller, a microprocessor, or other electronic components for performing the fingerprint identification method described in FIG. 5.

In an aspect of the disclosure, there is also provided a non-transitory computer readable storage medium including instructions, such as the memory 604 including the instructions. The instructions may be executed by the processor 620 of the device 600 to complete the method described above. For example, the non-transitory computer readable storage medium may be a ROM, a random access memory (RAM), a CD-ROM, a magnetic tape, a floppy disk, an optical data storage device, etc.

A non-transitory computer readable storage medium comprising instructions that, when executed by the processor of a terminal, cause the terminal to perform the fingerprint identification method provided in the embodiment shown in FIG. 5.

Other embodiments of the present disclosure can be available to those skilled in the art upon consideration of the specification and practice of the invention disclosed herein. The present disclosure is intended to cover any variations, uses, or adaptations of the present disclosure following general principles of the present disclosure and include the common general knowledge or conventional technical means in the art without departing from the present disclosure. The specification and examples are shown as illustrative only, and the true scope and spirit of the disclosure are defined by the following claims.

It is to be understood that this disclosure is not limited to the precise constructions described above or shown in the enclosed drawings, and various modifications and/or changes may be made without departing from the scope thereof. The scope of the present disclosure is limited only by the appended claims.

What is claimed is:

1. An organic light-emitting diode (OLED) panel, comprising:
   an OLED pixel array including a plurality of OLED sub-pixels configured to emit light rays of M different wavelength ranges, wherein M is a natural number not less than 3; and
   a photoelectric detection circuitry including a plurality of photoelectric detectors configured to detect the light rays of M different wavelength ranges;
   wherein the plurality of photoelectric detectors are respectively disposed between the plurality of OLED sub-pixels;
   wherein at least one of the plurality of photoelectric detectors is configured to detect light rays whose wavelength ranges are outside of wavelength ranges of light rays emitted from the plurality of OLED sub-pixels adjacent to the photoelectric detector such that the at least one of the plurality of photoelectric detectors is protected from interference from the light rays emitted from the adjacent OLED sub-pixels, wherein the plurality of OLED sub-pixels comprise a G sub-pixel, a B sub-pixel and an R sub-pixel, and wherein at least one of the plurality of photoelectric detectors is between the R sub-pixel and the G sub-pixel and is adjacent to the R sub-pixel and the G sub-pixel and is configured to detect blue light, at least one of the plurality of photoelectric detectors is between the R sub-pixel and the B sub-pixel and is adjacent to the R sub-pixel and the B sub-pixel and is configured to detect green light, and, at least one of the plurality of photoelectric detectors is between the G sub-pixel and the B sub-pixel and is adjacent to the G sub-pixel and the B sub-pixel and is configured to detect red light.

2. The OLED panel of claim 1, wherein the photoelectric detection circuitry is configured to form a portion of a detection circuit of a photoelectric biometric sensor.

3. The OLED panel of claim 2, wherein the photoelectric biometric sensor is a fingerprint sensor or a palm print sensor.

4. The OLED panel of claim 3, wherein the fingerprint sensor is configured to simultaneously identify fingerprints of at least two fingers.

5. The OLED panel of claim 1, wherein the plurality of photoelectric detectors are respectively disposed at gaps between the plurality of OLED sub-pixels.

6. The OLED panel of claim 1, wherein the plurality of photoelectric detectors are respectively disposed on black matrixes between the plurality of OLED sub-pixels.

7. An organic light-emitting diode (OLED) apparatus, comprising an OLED panel and a drive circuit;
   wherein the OLED panel includes:
   an OLED pixel array including a plurality of OLED sub-pixels configured to emit light rays of M different wavelength ranges, wherein the M is a natural number not less than 3; and
   a photoelectric detection circuitry including a plurality of photoelectric detectors to detect the light rays of M different wavelength ranges;
   wherein the plurality of photoelectric detectors are respectively disposed between the plurality of OLED sub-pixels;
   wherein at least one of the plurality of photoelectric detectors is configured to detect light rays whose wavelength ranges are outside of wavelength ranges of light rays emitted from the plurality of OLED sub-pixels adjacent to the photoelectric detector such that the at least one of the plurality of photoelectric detectors is protected from interference from the light rays emitted from the adjacent OLED sub-pixels,
   wherein the plurality of OLED sub-pixels comprise a G sub-pixel, a B sub-pixel and an R sub-pixel, and wherein at least one of the plurality of designated photoelectric detectors is between the R sub-pixel and the G sub-pixel and is adjacent to the R sub-pixel and the G sub-pixel and is configured to detect blue light, at least one of the plurality of photoelectric detectors is between the R sub-pixel and the B sub-pixel and is adjacent to the R sub-pixel and the B sub-pixel and is configured to detect green light, and, at least one of the plurality of photoelectric detectors is between the G sub-pixel and the B sub-pixel and is adjacent to the G sub-pixel and the B sub-pixel and is configured to detect red light; and
   wherein the drive circuit is configured to:
   identify, in response to a touch operation for fingerprint identification, a location of a touch area being touched;
   enable, based on the location of the touch area, a plurality of OLED sub-pixels to emit light rays;
   select, based on the location of the touch area, a plurality of designated photoelectric detectors from the plurality of photoelectric detectors; and
   detect reflected light of the light rays with the plurality of designated photoelectric detectors; and
   generate a fingerprint image based on positions of the plurality of designated photoelectric detectors and intensities of the reflected light detected by the plurality of designated photoelectric detectors.

8. The OLED apparatus of claim 7, wherein the drive circuit is configured to:
   select all of the plurality of photoelectric detectors as the designated photoelectric detectors; or,
   select the photoelectric detectors located in the touch area among the plurality of photoelectric detectors as the designated photoelectric detectors.

9. The OLED apparatus of claim 8, wherein the drive circuit is configured to:
   determine a ridge line position in the fingerprint image corresponding to the position of the designated photoelectric detector, for each of the plurality of designated photoelectric detectors, when the intensity of the reflected light detected by the designated photoelectric detector is within a first preset intensity range, wherein the ridge line is formed by a protruding portion on a fingerprint epidermis; and
   determine, when the intensity of the reflected light detected by the designated photoelectric detector is within a second preset intensity range, a valley line position in the fingerprint image corresponding to the position of the designated photoelectric detector, wherein the valley line is formed by a recessed portion on the fingerprint epidermis.

10. The OLED apparatus of claim 7, wherein the drive circuit is configured to:
determine a ridge line position in the fingerprint image corresponding to the position of the designated photoelectric detector, for each of the plurality of designated photoelectric detectors, when the intensity of the reflected light detected by the designated photoelectric detector is within a first preset intensity range, wherein the ridge line is formed by a protruding portion on a fingerprint epidermis; and
determine, when the intensity of the reflected light detected by the designated photoelectric detector is within a second preset intensity range, a valley line position in the fingerprint image corresponding to the position of the designated photoelectric detector, wherein the valley line is formed by a recessed portion on the fingerprint epidermis.

11. A fingerprint identification method applied to a terminal provided with an organic light-emitting diode (OLED) panel, wherein the OLED panel includes:
an OLED pixel array including a plurality of OLED sub-pixels configured to emit light rays of M different wavelength ranges, wherein the M is a natural number not less than 3; and
a photoelectric detection circuitry including a plurality of photoelectric detectors configured to detect the light rays of M different wavelength ranges;
wherein the plurality of photoelectric detectors are respectively disposed between the plurality of OLED sub-pixels;
wherein at least one of the plurality of photoelectric detectors is configured to detect light rays whose wavelength ranges are outside of wavelength ranges of light rays emitted from the plurality of OLED sub-pixels adjacent to the photoelectric detector such that the at least one of the plurality of photoelectric detectors is protected from interference from the light rays emitted from the adjacent OLED sub-pixels, wherein the plurality of OLED sub-pixels comprise a G sub-pixel, a B sub-pixel and an R sub-pixel, and wherein at least one of the plurality of photoelectric detectors is between the R sub-pixel and the G sub-pixel and is adjacent to the R sub-pixel and the G sub-pixel and is configured to detect blue light, at least one of the plurality of photoelectric detectors is between the R sub-pixel and the B sub-pixel and is adjacent to the R sub-pixel and the B sub-pixel and is configured to detect green light, and, at least one of the plurality of photoelectric detectors is between the G sub-pixel and the B sub-pixel and is adjacent to the G sub-pixel and the B sub-pixel and is configured to detect red light; and
the method further comprising:
identifying, in response to a touch operation for fingerprint identification, a location of a touch area being touched;
enabling, based on the location of the touch area, a plurality of OLED sub-pixels to emit light rays;
selecting, based on the location of the touch area, a plurality of designated photoelectric detectors from the plurality of photoelectric detectors; and detecting reflected light of the light rays with the plurality of designated photoelectric detectors; and
generating a fingerprint image based on positions of the plurality of designated photoelectric detectors and intensities of the reflected light detected by the plurality of designated photoelectric detectors.

12. The method of claim 11, wherein selecting the plurality of designated photoelectric detectors from the plurality of photoelectric detectors includes:
selecting each of the plurality of photoelectric detectors as the designated photoelectric detector; or,
selecting the photoelectric detectors located in the touch area among the plurality of photoelectric detectors as the designated photoelectric detectors.

13. The method of claim 12, wherein generating the fingerprint image based on the positions of the plurality of designated photoelectric detectors and the intensities of the reflected light detected by the plurality of designated photoelectric detectors includes:
determining a ridge line position in the fingerprint image corresponding to the position of the designated photoelectric detector, for each of the plurality of designated photoelectric detectors, when the intensity of the reflected light detected by the designated photoelectric detector is within a first preset intensity range, wherein the ridge line is formed by a protruding portion on a fingerprint epidermis; and
determining, when the intensity of the reflected light detected by the designated photoelectric detector is within a second preset intensity range, a valley line position in the fingerprint image corresponding to the position of the designated photoelectric detector, wherein the valley line is formed by a recessed portion on the fingerprint epidermis.

14. The method of claim 11, wherein generating the fingerprint image based on the positions of the plurality of designated photoelectric detectors and the intensities of the reflected light detected by the plurality of designated photoelectric detectors includes:
determining a ridge line position in the fingerprint image corresponding to the position of the designated photoelectric detector, for each of the plurality of designated photoelectric detectors, when the intensity of the reflected light detected by the designated photoelectric detector is within a first preset intensity range, wherein the ridge line is formed by a protruding portion on a fingerprint epidermis; and
determining, when the intensity of the reflected light detected by the designated photoelectric detector is within a second preset intensity range, a valley line position in the fingerprint image corresponding to the position of the designated photoelectric detector, wherein the valley line is formed by a recessed portion on the fingerprint epidermis.

15. The method of claim 11, wherein the plurality of photoelectric detectors are respectively disposed at gaps between the plurality of OLED sub-pixels.

16. The method of claim 11, wherein the plurality of photoelectric detectors are respectively disposed on black matrixes between the plurality of OLED sub-pixels.

17. A fingerprint identification device with an organic light-emitting diode (OLED) panel, wherein the OLED panel includes:
an OLED pixel array including a plurality of OLED sub-pixels configured to emit light rays of M different wavelength ranges, wherein the M is a natural number not less than 3; and
a photoelectric detection circuitry including a plurality of photoelectric detectors configured to detect the light rays of M different wavelength ranges;

wherein the plurality of photoelectric detectors are respectively disposed at gaps between the plurality of OLED sub-pixels, or the plurality of photoelectric detectors are respectively disposed on black matrixes between the plurality of OLED sub-pixels;

wherein at least one of the plurality of photoelectric detectors is configured to detect light rays whose wavelength ranges are outside of wavelength ranges of light rays emitted from the plurality of OLED sub-pixels adjacent to the photoelectric detector such that the at least one of the plurality of photoelectric detectors is protected from interference from the light rays emitted from the adjacent OLED sub-pixels, wherein the plurality of OLED sub-pixels comprise a G sub-pixel, a B sub-pixel and an R sub-pixel, and wherein at least one of the plurality of designated photoelectric detectors is between the R sub-pixel and the G sub-pixel and is adjacent to the R sub-pixel and the G sub-pixel and is configured to detect blue light, at least one of the plurality of photoelectric detectors is between the R sub-pixel and the B sub-pixel and is adjacent to the R sub-pixel and the B sub-pixel and is configured to detect green light, and, at least one of the plurality of photoelectric detectors is between the G sub-pixel and the B sub-pixel and is adjacent to the G sub-pixel and the B sub-pixel and is configured to detect red light;

the device includes:

a processor; and a memory storing executable instructions executed by the processor;

wherein the processor is configured to:

identify, in response to a touch operation for fingerprint identification, a location of a touch area being touched;

enable, based on the location of the touch area, a plurality of OLED sub-pixels to emit light rays;

select, based on the location of the touch area, a plurality of designated photoelectric detectors from the plurality of photoelectric detectors; and detect reflected light of the light rays with the plurality of designated photoelectric detectors; and generate a fingerprint image based on positions of the plurality of designated photoelectric detectors and intensities of the reflected light detected by the plurality of designated photoelectric detectors.

18. The device of claim 17, wherein the processor is configured to:

select all of the plurality of photoelectric detectors as the designated photoelectric detectors; or, select the photoelectric detectors located in the touch area among the plurality of photoelectric detectors as the designated photoelectric detectors.

19. The device of claim 18, wherein the processor is configured to:

determine a ridge line position in the fingerprint image corresponding to the position of the designated photoelectric detector, for each of the plurality of designated photoelectric detectors, when the intensity of the reflected light detected by the designated photoelectric detector is within a first preset intensity range, wherein the ridge line is formed by a protruding portion on a fingerprint epidermis; and determine, when the intensity of the reflected light detected by the designated photoelectric detector is within a second preset intensity range, a valley line position in the fingerprint image corresponding to a position of the designated photoelectric detector, wherein the valley line is formed by a recessed portion on the fingerprint epidermis.

20. The device of claim 17, wherein the processor is configured to:

determine a ridge line position in the fingerprint image corresponding to the position of the designated photoelectric detector, for each of the plurality of designated photoelectric detectors, when the intensity of the reflected light detected by the designated photoelectric detector is within a first preset intensity range, wherein the ridge line is formed by a protruding portion on a fingerprint epidermis; and determine, when the intensity of the reflected light detected by the designated photoelectric detector is within a second preset intensity range, a valley line position in the fingerprint image corresponding to a position of the designated photoelectric detector, wherein the valley line is formed by a recessed portion on the fingerprint epidermis.

\* \* \* \* \*